United States Patent
Andersen et al.

(10) Patent No.: US 10,682,734 B2
(45) Date of Patent: Jun. 16, 2020

(54) INTERNAL CAVITY SUPPORT METHODOLOGY FOR ULTRASONIC ADDITIVE MANUFACTURING

(71) Applicant: Raytheon Company, Waltham, MA (US)

(72) Inventors: Michael L. Andersen, Denver, CO (US); Travis L. Mayberry, Dallas, TX (US); James A. Pruett, Allen, TX (US); John S. Moore, Indianapolis, IN (US)

(73) Assignee: Raytheon Company, Waltham, MA (US)

( * ) Notice: Subject to any disclaimer, the term of this patent is extended or adjusted under 35 U.S.C. 154(b) by 282 days.

(21) Appl. No.: 15/176,733

(22) Filed: Jun. 8, 2016

(65) Prior Publication Data

US 2017/0356698 A1 Dec. 14, 2017

(51) Int. Cl.
| | |
|---|---|
| *B23P 15/26* | (2006.01) |
| *B23K 20/10* | (2006.01) |
| *H01L 21/48* | (2006.01) |
| *B33Y 10/00* | (2015.01) |
| *B33Y 80/00* | (2015.01) |

(52) U.S. Cl.
CPC .............. *B23P 15/26* (2013.01); *B23K 20/10* (2013.01); *H01L 21/4871* (2013.01); *B33Y 10/00* (2014.12); *B33Y 80/00* (2014.12)

(58) Field of Classification Search
CPC ....... B21D 53/022; B23P 15/26; B33Y 10/00; B33Y 80/00; F28D 9/0093; F28F 3/02; F28F 3/04; F28F 3/048; F28F 3/08; F28F 3/12; F28F 9/02; H05K 7/20163; H05K 7/20254
See application file for complete search history.

(56) References Cited

U.S. PATENT DOCUMENTS

| | | | | |
|---|---|---|---|---|
| 8,136,577 B2* | 3/2012 | Edward | .............. | H05K 7/20154 165/185 |
| 8,522,861 B2* | 9/2013 | Zaffetti | ................. | H01L 23/473 165/104.33 |
| 2003/0024693 A1* | 2/2003 | Petty | ..................... | H01L 23/467 165/121 |
| 2008/0149313 A1* | 6/2008 | Slaughter | .............. | B22F 3/1055 165/148 |
| 2010/0071887 A1* | 3/2010 | Sugiyama | ............. | F24F 12/006 165/166 |

(Continued)

*Primary Examiner* — Eric S Ruppert
*Assistant Examiner* — Hans R Weiland
(74) *Attorney, Agent, or Firm* — Renner, Otto, Boiselle & Sklar, LLP

(57) ABSTRACT

A manifold structure and method of forming a manifold structure includes using an ultrasonic additive manufacturing (UAM) process to build up a solid structure, machining the solid structure to form a cavity and free-standing support pillars within the cavity, and using a UAM process to build up a finstock layer over the cavity. The support pillars formed by machining have yield strengths high enough to support UAM of the finstock layer over the cavity. A plurality of finstock layers are built up within the cavity to segment the cavity into a plurality of cavities. UAM of the finstock layers enables the finstock layers to be stacked in a direction normal to a direction of flow through the cavity for efficiently transferring heat through the manifold structure.

11 Claims, 5 Drawing Sheets

(56) References Cited

U.S. PATENT DOCUMENTS

| | | | |
|---|---|---|---|
| 2010/0157540 A1* | 6/2010 | Yu | F28F 3/02 |
| | | | 361/710 |
| 2015/0007969 A1* | 1/2015 | Pal | F28F 3/02 |
| | | | 165/166 |
| 2015/0137412 A1* | 5/2015 | Schalansky | B22F 3/1055 |
| | | | 264/129 |
| 2015/0290711 A1* | 10/2015 | Norfolk | B23K 20/103 |
| | | | 425/78 |
| 2015/0352661 A1* | 12/2015 | Karlen | B33Y 10/00 |
| | | | 428/586 |

* cited by examiner

INTERNAL CAVITY SUPPORT METHODOLOGY FOR ULTRASONIC ADDITIVE MANUFACTURING

FIELD OF THE INVENTION

The invention relates to structures manufactured using ultrasonic additive manufacturing, and more particularly, forming structures with free spaces using ultrasonic additive manufacturing.

DESCRIPTION OF THE RELATED ART

Ultrasonic additive manufacturing (UAM) is an additive manufacturing technique in which metal foils are welded to one another to form a solid structure. The solid structure may be a free-standing structure or an added part to an existing solid part. The UAM process is a solid-state metal deposition process that enables the build-up of metal components to form the structure. During the UAM process, high-frequency ultrasonic vibrations are applied to metal foil materials to break oxide layers on metal tapes and create a solid-state weld. Relatively large forces are applied to the metal tapes to hold the tapes together and form a metallurgical bond between the tapes.

UAM is generally used to form structures having complex internal features. UAM may be advantageous in forming a structure having internal cavities, such as a structure that provides heating or cooling for a surface to which the structure is affixed. In such an application the structure may be a manifold or any other suitable structure that contains at least one flow passage allowing fluid flow through the structure. Applying the metal tapes over the cavities to build up the structure may result in the tape layers bowing or deforming into the empty space of the cavity and effectively changing the geometry of the empty space. The change in geometry may have adverse effects on fluid flow through the passage.

SUMMARY OF THE INVENTION

Ultrasonic additive manufacturing (UAM) is advantageous in forming a manifold structure, such as a heat exchanger, for use in applications such as cooling electronics. A finned heat exchanger provides for more efficient heat transfer, by way of convection across the finstock. Using UAM to build up layers of finstock in a flow passage of the heat exchanger allows layers of finstock to be horizontally stacked in a direction normal to the direction of heat flow through the flow passage. The arrangement of the finstock provides more efficient heat transfer as compared with conventional heat exchangers that have vertically-arranged finstock. Cavities between the finstock layers are maintained to provide additional flow passages. To maintain the cavities, free-standing support pillars are machined within the cavity to support the finstock layer during UAM. Machining the support pillars produces pillars having a greater yield strength than conventional support pins or posts. The conventional support pins or posts are subsequently brazed into the cavity and have lower yield strengths that are not suitable for the high forces applied during UAM.

According to an aspect of the invention, a method of forming a manifold structure includes using an ultrasonic additive manufacturing process to build up a solid structure by applying tapes in a layer-by-layer process, machining the solid structure to form a cavity and a plurality of free-standing support pillars within the cavity, using an ultrasonic additive manufacturing process to build up a finstock layer over the cavity by applying tapes in a layer-by-layer process, and bridging the pillars with the finstock layer to enclose the cavity.

According to an aspect of the invention, the method may include forming the finstock layer in a direction normal to a direction of fluid flow through the cavity.

According to an aspect of the invention, the method may include forming the solid structure on a heated surface and forming the finstock layer in a direction normal to the heated surface.

According to an aspect of the invention, the method may include machining a flow passage in the solid structure, forming a plurality of finstock layers within the flow passage, and spacing the finstock layers to segment the flow passage into cavities allowing fluid flow therethrough.

According to an aspect of the invention, forming the plurality of finstock layers may include horizontally stacking the finstock layers in a direction normal to a direction of fluid flow through the flow passage.

According to an aspect of the invention, the method may include forming a plurality of support pillars having a height to width ratio that is less than one.

According to an aspect of the invention, the method may include forming the plurality of support pillars having an elongated length extending in a direction parallel to a direction of fluid flow through the cavity.

According to an aspect of the invention, the method may include forming the plurality of support pillars in an ordered pattern.

According to an aspect of the invention, the method may include evenly spacing the plurality of support pillars in aligned rows and columns.

According to an aspect of the invention, machining the solid structure may include using a computer numerical control milling process.

According to an aspect of the invention, machining the solid structure to form the plurality of free-standing support pillars may include using a computer numerical control milling process.

According to an aspect of the invention, a manifold structure includes: at least one flow passage, a plurality of finstock layers arranged within the flow passage, where the finstock layers segment the flow passage into a plurality of flow cavities, and a plurality of free-standing support pillars arranged within the flow cavities and extending between the finstock layers to support the finstock layers. The finstock layers are stacked in a direction normal to a direction of fluid flow through the flow passage. The support pillars are elongated in the direction of fluid flow through the flow passage.

According to an aspect of the invention, the support pillars may be evenly spaced and arranged in an ordered pattern.

According to an aspect of the invention, the support pillars may have a height-to-width ratio that is less than one.

According to an aspect of the invention, the support pillars may be arranged in aligned rows and aligned columns.

According to an aspect of the invention, the manifold structure may be affixed to a heated surface and the finstock layers are stacked in a direction normal to the heated surface.

According to an aspect of the invention, the manifold structure may be a cross-flow heat exchanger having a longitudinal flow passage and a transverse flow passage, wherein the plurality of support pillars are arranged in the longitudinal flow passage and the transverse flow passage.

According to an aspect of the invention, the cross-flow heat exchanger may be a plate fin heat exchanger.

According to an aspect of the invention, the finstock layers may be formed of an aluminum alloy.

According to an aspect of the invention, the manifold structure may include heat spreaders arranged in a direction parallel to the finstock layers, wherein the heat spreaders are formed of copper.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

The annexed drawings, which are not necessarily to scale, show various aspects of the invention.

DETAILED DESCRIPTION

The principles described herein have particular application in the ultrasonic additive manufacturing (UAM) process of metal parts. UAM is advantageous in forming manifold structures due to the capabilities of UAM in producing complex internal features within metallic materials. Examples of complex internal features that may be formed by UAM include honeycomb structures, internal pipes or channels, and enclosed cavities. A cooling manifold structure formed by UAM may be implemented in various applications, and in particular, aerospace applications such as radar structures that have electronics to be cooled.

A cooling manifold structure according to the present application may be affixed or attached to a surface to be cooled. The manifold structure may be finned for more efficient heat transfer through the manifold structure, by way of convection across the finstock. The finstock may be sheet-like in shape. Using UAM to build up layers of finstock in a cavity or flow passage of the manifold structure allows the layers or sheets of finstock to be oriented horizontally and stacked in a direction normal to the direction of heat flow. The finstock is also oriented in a direction normal to the heated surface. The arrangement of the finstock provides more efficient heat transfer through the manifold structure as compared with conventional manifold structures that have vertically-arranged finstock.

Cavities between the finstock layers are maintained to allow fluid flow through the manifold structure. To maintain the cavity, free-standing, vertical support pillars are machined within the cavity to provide a working surface area for the UAM of a finstock layer over the cavity. Machining the support pillars produces pillars having a greater yield strength than conventionally-used support pins or posts that are subsequently brazed into the cavity. The support pillars are arranged in an ordered pattern and have a predetermined height-to-width ratio of less than one-to-one. The support pillars are elongated in the direction of flow through the cavity to minimize the surface area used to support the finstock layers while maximizing the flow through the cavity.

Figure 1:
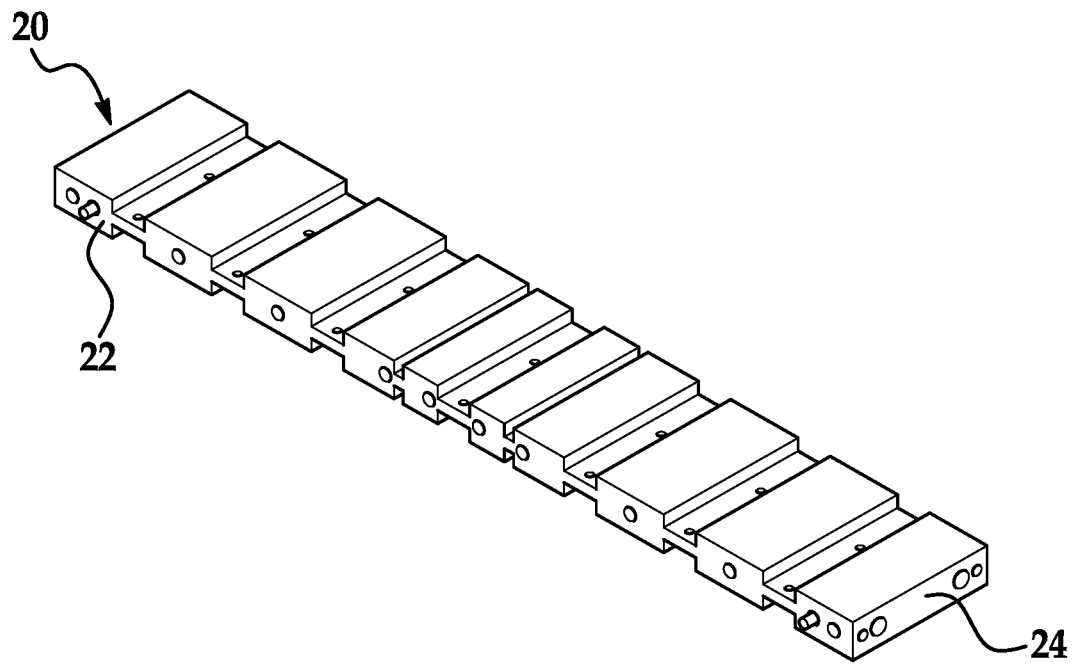
FIG. 1 is a schematic drawing showing an oblique view of a manifold structure.
Figure 2:
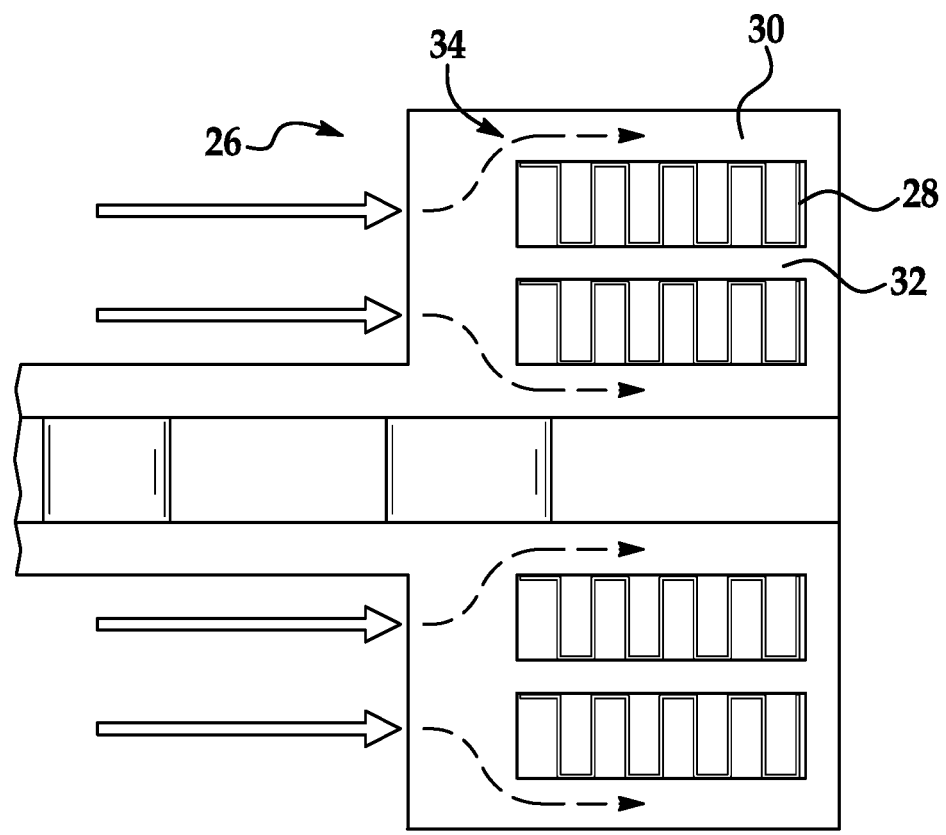
FIG. 2 is a schematic drawing showing a cross-sectional view of the manifold structure of FIG. 1 having vertically arranged finstock layers.

Referring now to FIG. 1, a manifold structure 20 is schematically shown. FIG. 1 is an oblique view of the manifold structure 20 showing a plurality of manifolds 22 extending through the structure 20 in a first flow direction and a plurality of manifolds 24 extending through the structure 20 in a second flow direction perpendicular to the first flow direction. Fluid flows through the structure 20 by way of the manifolds 22, 24 in fluid communication with a central cavity, or flow passage. As shown in FIG. 2, a prior art manifold structure 26 includes a plurality of corrugated die-formed fin sheets 28 interposed between flat metal separator plates 30, 32. The fin sheets or finstock 28 is arranged vertically along the flow path of heat travel 34.

The prior art manifold structure 20 is a multi-piece aluminum vacuum brazement with finstock 28. The layers of the finstock 28 are subsequently brazed into the cavities of the structure, which may result in the layers being offset or non-uniformly formed. Within the cavity, or flow passage of the structure 20, support pins or posts are brazed into the flow passage to support the finstock 28 during brazement. The brazed support posts are often formed of a metal other than the base metal of the structure such that the yield strength of the brazed support posts is less than that of the base metal. The lesser yield strength of the brazed support posts may result in bowing or deformation of the brazed finstock layers formed over the cavity.

Figure 3:
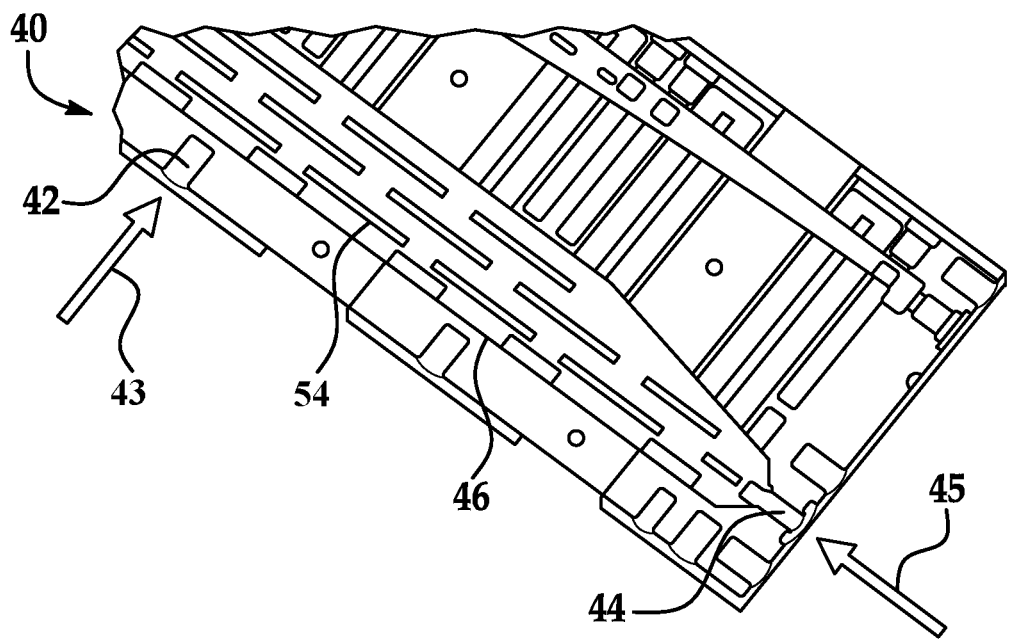
FIG. 3 is a schematic drawing showing a cross-sectional view of a manifold structure having machined support pillars that are arranged in an ordered pattern and have a height-to-width ratio of less than one-to-one.
Figure 4:
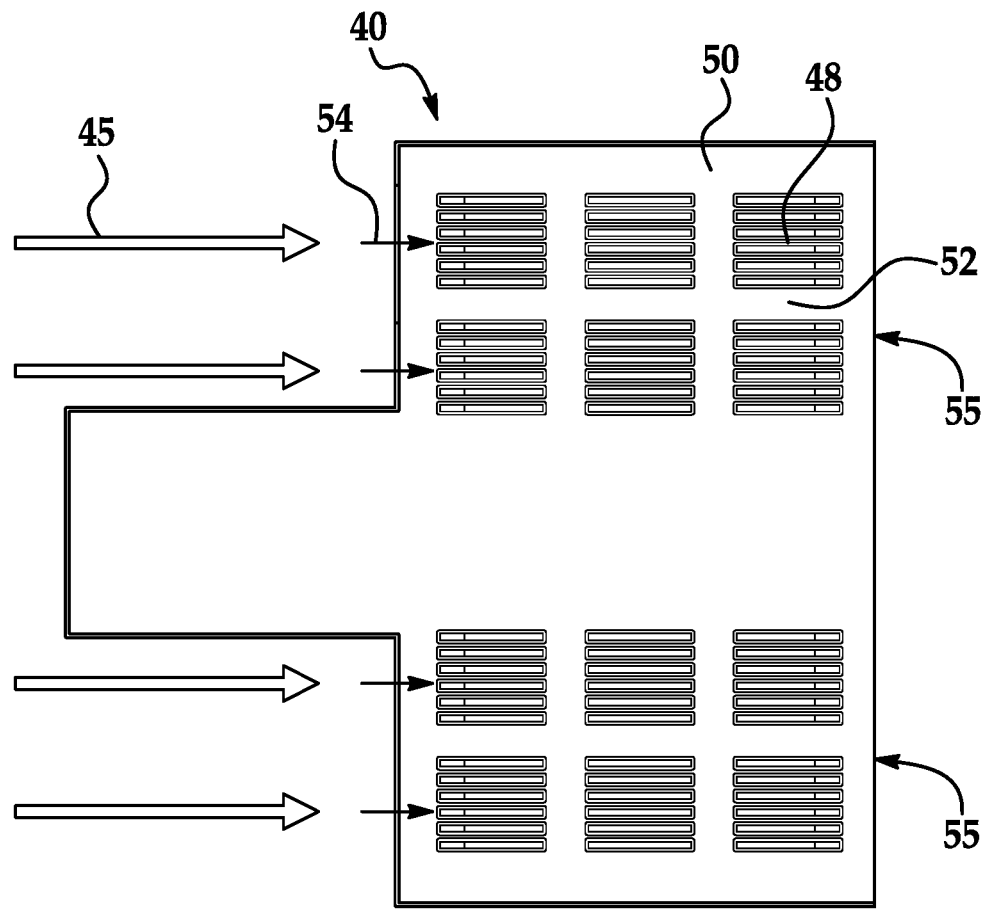
FIG. 4 is a schematic drawing showing a cross-sectional view of the manifold structure of FIG. 3 having horizontally arranged finstock layers.
Figure 5:
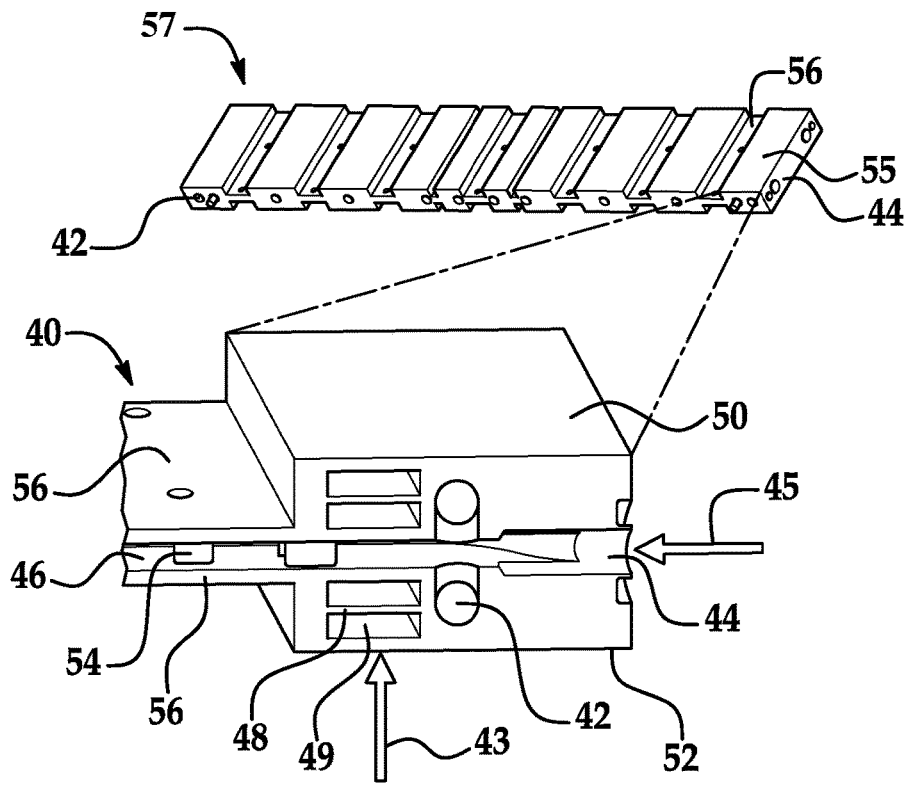
FIG. 5 is a schematic drawing showing an oblique view of the manifold structure of FIG. 3.

Referring now to FIGS. 3-5, a manifold structure 40 according to the present application is schematically shown. FIG. 3 is a cross-sectional view of the manifold structure 40 showing a plurality of manifolds 42 extending through the structure 40 in a first flow direction 43 and a plurality of manifolds 44 extending through the structure 40 in a second flow direction 45 perpendicular to the first flow direction. Fluid may flow through the structure 40 by way of the manifolds 40, 42 in fluid communication with flow passages 46. As shown in FIGS. 4 and 5, the finstock 48 is interposed between flat metal separator plates 50, 52 of the structure 40. The sheets of finstock 48 are arranged horizontally, or in a direction normal to the direction of heat flow 34 through the manifold structure 40, providing for a shorter and more direct path of heat travel relative to the heat travel path of the prior art where the finstock is arranged vertically. The finstock 48 may be arranged in a direction normal to the heated surface (not shown). In an improvement to the conventional brazed support posts, the finstock 48 is formed by a UAM process.

The flow passages 46 of the manifold structure 40 may extend in a longitudinal direction and a transverse direction. The layers of finstock 48 may extend through the flow passages 46 and define cavities 49 between each layer to enable flow through the respective flow passage 46. As shown in FIG. 5, the flow passage may be segmented by the finstock 48 such that the cavities 49 form sub-flow passages through the flow passage 46 in the flow direction 43. To maintain the cavity 49 during UAM fabrication of the finstock layer 48 over the cavity 49, a plurality of support pillars 54 are machined within the cavity 49, as shown in FIGS. 3 and 5. The support pillars 54 are arranged vertically. The support pillars 54 are independently and free-standing within the cavity 49 of the flow passage. Each support pillar 54 has a height-to-width ratio of less than one-to-one and is elongated along the flow passage 46, such that the length of the pillar extends in the direction of heat flow through the passage 46. The arrangement of the elongated pillars maximizes the working surface area of the pillars for supporting the finstock layers while minimizing the surface area that would disrupt flow through the cavity 49. An exemplary support pillar 54 may have a length between 0.25 centimeters (0.10 inches) and 0.76 centimeters (0.30 inches). An exemplary support pillar may have a width between 0.025 centimeters (0.010 inches) and 0.076 centimeters (0.030 inches). The ratio may be selected such that the pillar is wider than it is tall, preventing resonance when subsequent layers are built above the pillar. The support pillars 54 may be arranged in a predetermined ordered pattern within the flow passage 46 and the cavity 49 may have a width greater than 0.635 centimeters (0.25 inches). The pattern may include aligned columns and rows of the support pillars or offset columns and rows of the support pillars. Each pillar 54 may be evenly spaced or spaced by a distance of 0.635 centimeters or less. Any suitable spacing may be used and the spacing may be dependent on the application.

The manifold structure 40 includes a finned area or unit cell 55 that contains the horizontally arranged finstock 48. FIG. 4 is a schematic drawing of a two-unit cell structure. Each unit cell 55 may be in fluid communication with a manifold of the structure 40 allowing heat flow through the respective unit cell. The manifold structure 40 may include two or more unit cells, and the geometry of the two-unit cell may be repeated throughout the structure 40. As shown in FIG. 5, the two-unit cell 55 may be connected to another two-unit cell through thin transfer walls 56 that define a flow passage 46 therebetween. The finstock 48 may be arranged in a direction normal to the thin transfer walls 56. The two-unit cell 55 connected to another two-unit cell may form a four unit cell configuration. The four unit cell pattern may be repeated by connection of the thin transfer walls 56 between the unit cells to form a complete manifold part 57. In an exemplary configuration, the manifold part 57 may be around 50 centimeters (20 inches) long, although many other sizes are possible.

The manifold structure 40 may be a cross-flow heat exchanger for cooling a heated surface, where manifold 42 is a longitudinal flow passage and manifold 44 is a transverse flow passage. The cross-flow heat exchanger may be a plate fin heat exchanger, such that separate hot and cold fluid streams may flow through alternating layers of the heat exchanger. The flow passages 42, 44 are arranged perpendicular to one another, such that a first fluid may pass through a flow passage and a second fluid may pass around the flow passage at a 90 degree angle. The finstock 48 is provided for structural integrity of the heat exchanger and providing an extended surface area for heat transfer through the heat exchanger. The finstock 48 is generally square-shaped. In an exemplary embodiment, the finstock 48 may have a thickness between 0.013 centimeters (0.005 inches) and 0.018 centimeters (0.007 inches).

The finstock 48 is configured to increase heat transfer from the heated surface to which the manifold structure 40 is attached, via the surface area of the finstock 48. The finstock 48 enables heat flow through the manifold structure 40 by way of convection. The finstock 48 accommodates for reduction in temperature potential between the finstock 48 and the ambient fluid due to conduction along the finstock 48 and convection from or to the surface of the finstock 48. The fin efficiency is dependent on fin geometry, fin material thermal conductivity, and a heat transfer coefficient at the fin surface. As best shown in FIG. 5, arranging the finstock 48 normal to the surface effectively changes the geometry of the fin, by providing a more direct heat transfer path through the heat exchanger.

Machining the support pillars 54 allows UAM fabrication of the finstock 48 layers over the cavities. The prior art discloses brazed posts with yield strengths that are unable to support the cavity during the UAM process of the finstock 48. The support pillars 54 are formed of metal that may have yield strengths between 200 and 300 megapascals, such that the support pillars 54 may support UAM pressures of around 2 megapascals (250 pounds per square inch). During the relatively high force applied during the UAM process, the prior art brazed posts would buckle or fracture. In addition to having increased yield strengths, the support pillars 54 provide a maximum working surface area for welding of the finstock layer over the cavity. The surface area of the support pillar 54 may be between 1 micrometer and 100 micrometers. Using UAM fabrication, forming the finstock is also economical in that the finstock does not need to be separately purchased and subsequently placed in the metal part, or brazed into the metal part.

Figure 6:
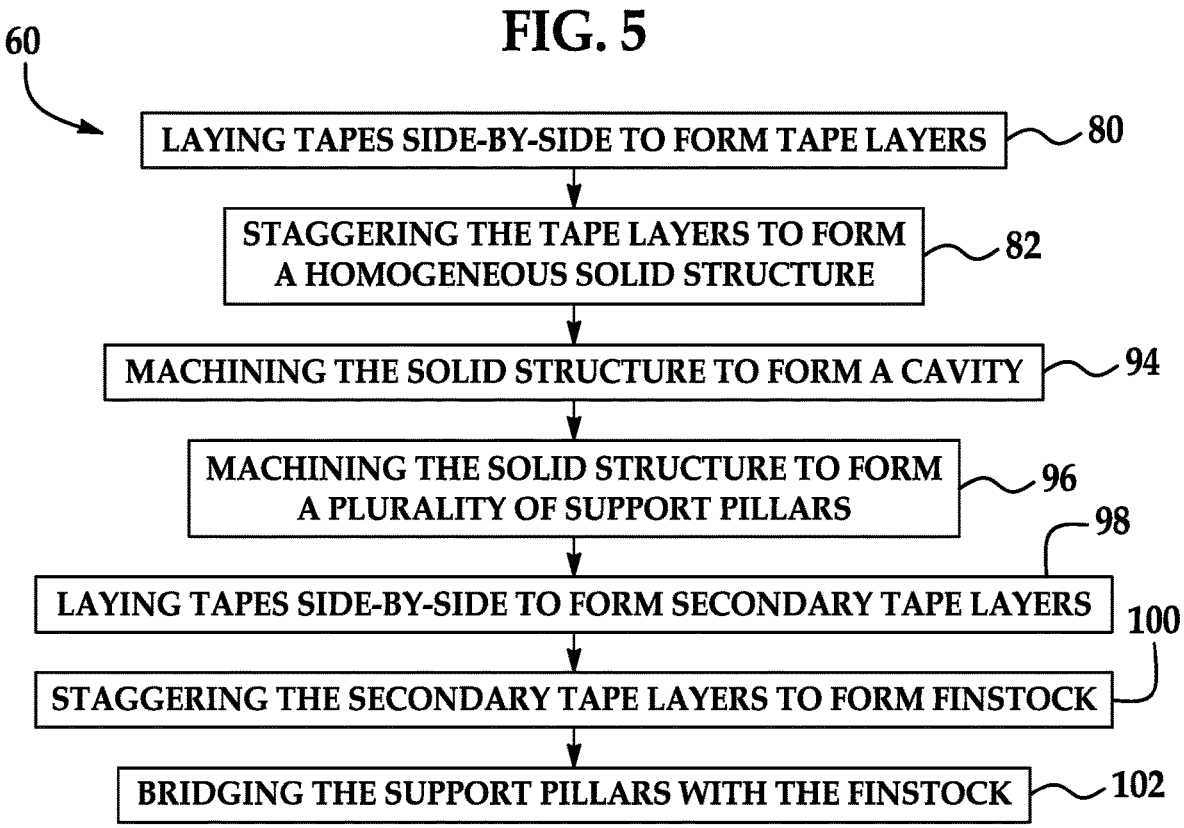
FIG. 6 is a flow chart illustrating a method of forming the manifold structure of FIG. 3.
Figure 7:
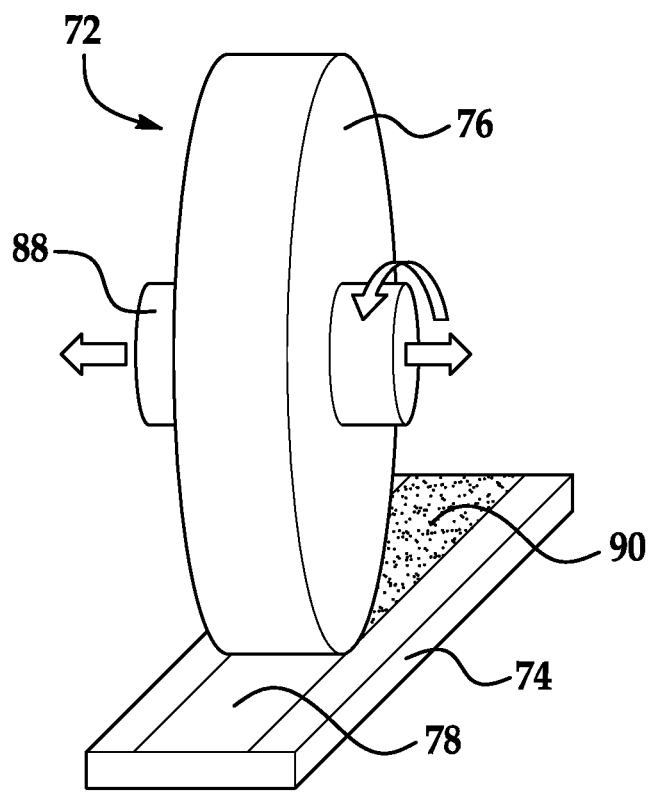
FIG. 7 is a schematic drawing showing an oblique view of a system for performing an ultrasonic additive manufacturing (UAM) process.
Figure 8:
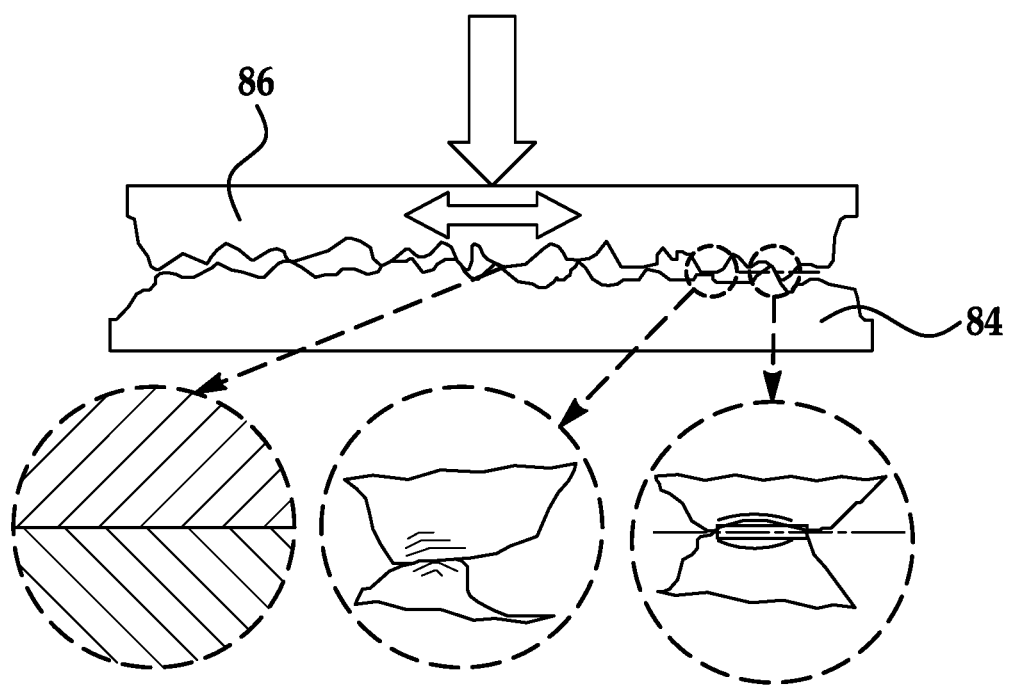
FIG. 8 is a schematic drawing showing an oblique view of metal tape layers that are merged together during the UAM process.
Figure 9:
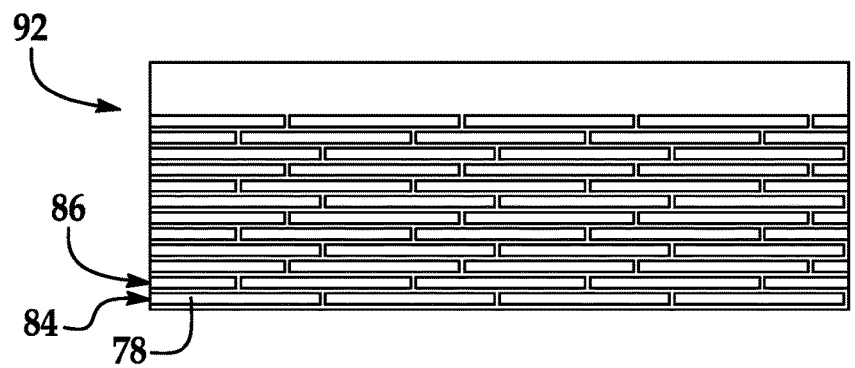
FIG. 9 is a schematic drawing showing a build-up of tape layers during the UAM process.

Referring in addition to FIGS. 6-9, a method and system for forming the manifold structure 40 are schematically illustrated. FIG. 6 is a flow chart illustrating a method 60 of forming the manifold structure 40. FIGS. 7-9 are schematic drawings illustrating the system used to form the manifold structure 40. The method 60 includes using UAM to build a metal part or structure. FIG. 7 is a schematic drawing of a UAM machine 72. The UAM process may be used to build up the part on a base plate 74 that is an existing part or a portion of an existing structure. The base plate 74 may be a heated substrate having a temperature in a range from near ambient room temperature up to 200 degrees Celsius. The UAM machine 72 includes a rotatable sonotrode 76 that travels along a length of a thin metal foil, or tape 78. The tape 78 may have a width between 100 and 150 microns and a thickness between 1.25 centimeters (0.5 inches) and 3.80 centimeters (1.5 inches). The sonotrode 76 is used to apply a force normal to the tape 78 to hold the tape 78 to the base plate 74 or another tape.

Step 80 of the method 60 includes laying the tapes 78 side-by-side to form a tape layer. Step 80 is repeated to form a plurality of tape layers. After a tape layer is formed, step 82 includes staggering the tape layers to form a homogenous structure that does not contain gaps between the tapes. Referring in addition to FIG. 8, a schematic drawing of the merging or welding of tape layers 84, 86 is shown. The sonotrode 76 may include transducers 88 that produce vibrations to oscillate the sonotrode 76 transversely to the direction of rotation of the sonotrode 76. The sonotrode 76 may oscillate at a constant frequency, around 20 kilohertz, to break oxide layers on the tapes of the tape layers 84, 86 to be adjoined to form a bonded or welded tape 90. FIG. 9 shows the tapes 78 laid side-by-side to form the layers 84, 86. The layers 84, 86 are stacked such that the tapes 78 of each layer are staggered. Each layer is welded or merged to a previously formed layer, such that the homogeneous part 92 is formed by building up the layers.

When the homogeneous part or solid structure 92 is formed by the UAM process, step 94 includes machining the solid structure 92 to form an internal geometrical feature of the part 92. Step 94 of the method 60 may include forming a cavity, or flow passage 46 of the manifold structure shown in FIGS. 3 and 5. The cavity may be formed to have a width greater than 0.25 inches. An advantage of providing the support pillars according to the present application is that the cavity or flow passage is more adequately supported during the application of the finstock layer, such that the cavity may have a greater width as compared to prior art structures having widths less than 0.25 inches. The cavity may be formed by computer numerical control (CNC) machining or milling. CNC machining is used to mill or trim the upward-facing surface of the part 92 to form the cavity. The CNC machining may include using a conical tool or a ball nose cutter to vertically mill into the part 92.

After the cavity or flow passage is formed, step 96 of the method 60 includes further machining the part 92 to form the plurality of support pillars 54 shown in FIGS. 3 and 5. The support pillars 54 may also be formed by CNC machining. The support pillars 54 are formed in an ordered pattern with height-to-width ratios of less than one-to-one. The support pillars 54 are spaced apart by 0.25 inches or less and each pillars 54 is elongated along the length of the cavity in which they are formed to support a finstock layer formed by UAM. Forming the support pillars 54 by CNC machining is advantageous over the brazen support posts of the prior art in that the support materials may be formed of the same metal material as the part 92, allowing the support pillars 54 to have stronger bonds between the layers of the part 92 than between the subsequently brazen support posts and the part 92.

After the plurality of support pillars 54 are formed in the cavity, UAM is used to form the finstock 48 of the manifold structure 40 shown in FIGS. 3 and 5. Step 98 of the method includes laying metal tapes side-by-side to form secondary tape layers and step 100 includes staggering the secondary tape layers to form the fin sheets or finstock 48. Similarly to steps 80 and 82, the UAM process is used to build-up the finstock 48. The sheets of finstock 48 may be a thin tape layer, having a thickness less than 0.25 centimeters (0.10 inches). During the UAM process of forming the finstock 48, step 102 of the method 60 includes bridging the support pillars 54 with the finstock 48. Bridging the support pillars 54 encloses the cavity formed between the initial tape layer and the finstock layer. The method 60 may be repeated to build up and form the manifold structure 40 shown in FIGS. 3-5.

Forming the manifold structure by UAM enables material properties of the base material of the metal part to be maintained. UAM also enables forming the manifold structure by welding of dissimilar metals and multi-material laminates, such that multiple metal foils may be combined. Examples of suitable metal materials for the UAM process include aluminum, beryllium, copper, gold, iron, molybdenum, nickel, palladium, platinum, tantalum, titanium, tungsten, and zirconium. Alloys of aluminum, copper, gold, iron, nickel and platinum may also be suitable. The material may include a ceramic-fiber reinforced metal matrix material. It should be recognized that the maximum width of the cavity to be supported in the part may be dependent on the material of the part. For example, the maximum width of an unsupported cavity in an H18 aluminum part may be between 0.200 inches and 0.240 inches due to lower tensile strengths and hardness properties as compared with other aluminum alloys. For increasing the maximum width of the unsupported cavity to greater than 0.250 inches, aluminum alloys or other materials having tensile strengths between 130 and 390 megapascals or a Brinell hardness number greater than 35 may be suitable. In an exemplary embodiment, an aluminum alloy such as 6061-T6 may be used.

Figure 10:
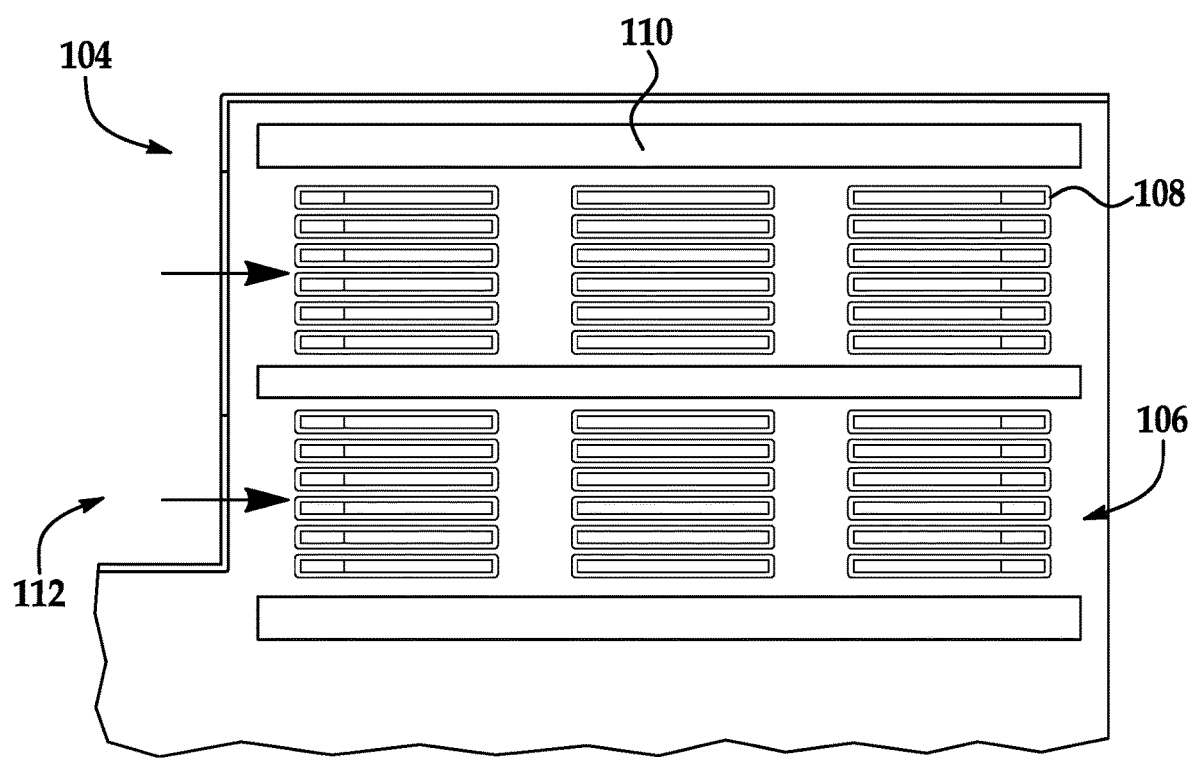
FIG. 10 is a schematic drawing showing a cross-sectional view of an exemplary manifold structure having copper heat spreaders.

Referring now to FIG. 10, a schematic drawing of a cross-sectional view of an exemplary manifold structure 104 is shown. The manifold structure 104 is formed of aluminum or an aluminum alloy. The aluminum structure 104 includes a finned area, or unit cell 106 that contains horizontally arranged finstock 108, similarly to the finstock shown in FIG. 4 and previously described. The aluminum structure 104 may include heat spreaders 110 that are arranged between the unit cells in a direction parallel to the horizontally arranged finstock 108 and normal to the heat transfer path 112. The heat spreaders 110 may be formed of copper or another suitable material. The heat spreaders 110 are arranged within the aluminum structure 104 to reduce overly heated areas along the flow path 112 through the aluminum structure 104. In another exemplary embodiment, the aluminum structure 104 may further include embedded thermocouples (not shown) for local temperature monitoring.

The manifold structure 20 according to the present application may be arranged as a cross-flow heat exchanger, for use in an aerospace application. For example, the manifold structure 20 may be used in a phased array antenna. As shown in FIG. 5, the manifold structure 20 has manifolds 42, 44 and multichannel passages or tubes connecting the manifolds 42, 44. The manifold structure 20 may be part of a heat exchanger for cooling an associated surface or portion of a heated component. The heated component may contain electronics to be cooled during operation.

The manifold structure or heat exchanger may be part of a phased array antenna (not shown) that includes a plurality of active circuits. Each active circuit is coupled through additional circuitry to at least one of a transmitter and receiver. The active circuits dissipate power as heat and the manifold structure according to the present application may be used to dissipate the heat from the phased array antenna. The phased array antenna may be configured as a radar module having a modular chassis. The chassis may be configured to perform the cooling function for the radar module, such as in the form of a heat sink drawing heat away from the active circuits. The manifolds may be configured to receive coolant to be circulated through the chassis.

The manifold structure described herein provides for machining support pillars within cavities between finstock layers, to form pillars having increased yield strengths to maintain the cavities during forming of the finstock layers by UAM. Using UAM, the finstock layers are arranged to optimize heat transfer through the manifold structure, such as in a direction normal to the heated surface. Increasing efficiency of the cooling function performed by the manifold structure allows for improved thermal performance of manifold structures used for cooling high power electronics.

Applications requiring cooling manifolds may implement fewer manifolds, given the increased efficiency of the manifold structure according to the present application. Providing fewer manifold structures decreases power used to pump coolant through the manifolds, effectively reducing the overall operating costs of the electronics and associated cooling manifold structure. In aerospace applications such as radars, the manifold structure according to the present application may be implemented to allow radars to operate at a higher energy level due to the improved detection of the radar by increased efficiency of cooling the circuitry.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A method of forming a metal manifold structure for cooling electronics, the method comprising:
    using an ultrasonic additive manufacturing process to build up a solid structure by applying tapes in a layer-by-layer process, wherein the layer-by-layer process includes:
        laying the tapes side-by-side to form a first tape layer;
        laying the tapes side-by-side to form a second tape layer over the first tape layer; and
        staggering the second tape layer over the first tape layer to form the solid structure, whereby the solid structure is seamless between the tapes;
    machining the solid structure to form a cavity and a plurality of free-standing support pillars that extend vertically within the cavity, each support pillar being elongated in a direction of heat flow through the cavity;
    using an ultrasonic additive manufacturing process to build up horizontal finstock layers stacked vertically over the cavity by applying tapes in a layer-by-layer process, wherein the plurality of free-standing support pillars maintain the cavity during the ultrasonic additive manufacturing process, and wherein building up the horizontal finstock layers includes forming sub-flow passages between the horizontal finstock layers; and
    bridging the pillars with the horizontal finstock layers to enclose the cavity.

2. The method of claim 1, wherein the method includes forming the finstock layers in a direction normal to the direction of heat flow through the cavity.

3. The method of claim 1, wherein the method includes forming the solid structure on a heated surface and forming the finstock layers in a direction normal to the heated surface.

4. The method of claim 1, wherein the method includes forming a plurality of support pillars having a height to width ratio that is less than one.

5. The method of claim 1, wherein the method includes forming the plurality of support pillars in an ordered pattern.

6. The method of claim 5, wherein the method includes evenly spacing the plurality of support pillars in aligned rows and columns.

7. The method of claim 1, wherein machining the solid structure includes using a computer numerical control milling process.

8. The method of claim 1, wherein machining the solid structure to form the plurality of free-standing support pillars includes using a computer numerical control milling process.

9. The method of claim 1, wherein the finstock layers are formed of an aluminum alloy.

10. The method of claim 1, further including arranging heat spreaders in a direction parallel to the finstock layers, wherein the heat spreaders are formed of copper.

11. A manifold structure formed by the method according to claim 1, wherein the manifold structure includes the plurality of support pillars that extend vertically and the horizontal finstock layers that are stacked vertically and define the sub-flow passages therebetween.

* * * * *